(12) United States Patent
Shinriki et al.

(10) Patent No.: US 7,354,622 B2
(45) Date of Patent: Apr. 8, 2008

(54) METHOD FOR FORMING THIN FILM AND APPARATUS FOR FORMING THIN FILM

(75) Inventors: Hiroshi Shinriki, Tokyo (JP); Kenji Matsumoto, Tokyo (JP); Toru Tatsumi, Tokyo (JP)

(73) Assignees: Tokyo Electron Limited, Tokyo (JP); NEC Corporation, Tokyo (JP)

( * ) Notice: Subject to any disclaimer, the term of this patent is extended or adjusted under 35 U.S.C. 154(b) by 763 days.

(21) Appl. No.: 10/311,880

(22) PCT Filed: Jun. 25, 2001

(86) PCT No.: PCT/JP01/05406

§ 371 (c)(1),
(2), (4) Date: Mar. 12, 2003

(87) PCT Pub. No.: WO01/99165

PCT Pub. Date: Dec. 27, 2001

(65) Prior Publication Data

US 2003/0170388 A1 Sep. 11, 2003

(30) Foreign Application Priority Data

Jun. 23, 2000 (JP) .............................. 2000-188821

(51) Int. Cl.
*C23C 16/00* (2006.01)
(52) U.S. Cl. .................. 427/252; 427/250; 427/248.1; 118/724
(58) Field of Classification Search ................ 427/252; 118/724
See application file for complete search history.

(56) References Cited

U.S. PATENT DOCUMENTS

| | | | | |
|---|---|---|---|---|
| 5,496,410 A | * | 3/1996 | Fukuda et al. | ............... 118/725 |
| 5,766,364 A | * | 6/1998 | Ishida et al. | ................ 118/725 |
| 6,126,753 A | | 10/2000 | Shinriki et al. | |
| 6,460,482 B1 | * | 10/2002 | Kuibira et al. | .......... 118/723 R |
| 6,800,139 B1 | * | 10/2004 | Shinriki et al. | ............. 118/715 |

FOREIGN PATENT DOCUMENTS

EP 909836 4/1999

(Continued)

OTHER PUBLICATIONS

Han Sang Song, et al., "Fabrication and Characterization of Ferroelectric Pb $(Zr_xTi_{1-x})O_3$ Thin Films by Metalorganic Chemical Vapor Deposition", Journal of Materials Research Mater. Res. Soc. USA, Feb. 1999, pp. 487-493, vol. 14, No. 2, XP002333549.

*Primary Examiner*—Timothy Meeks
*Assistant Examiner*—David Turocy
(74) *Attorney, Agent, or Firm*—Crowell & Moring LLP

(57) ABSTRACT

A shower head having a plurality of ejection holes for supplying an organic metal gas at uniform density to the surface of a substrate and a plurality of ejection holes for supplying an oxidizing gas at uniform density to the same is provided in a reaction furnace of an MOCVD system. A heater for heating the inside to a temperature higher than the thermal decomposition point of the organic metal gas but lower than the film forming temperature is provided in the vicinity of the substrate side surface of the shower head.

6 Claims, 4 Drawing Sheets

FOREIGN PATENT DOCUMENTS

| | | |
|---|---|---|
| EP | 1033743 | 9/2000 |
| EP | 1033743 A2 * | 9/2000 |
| EP | 1 119 016 A2 | 7/2001 |
| JP | 03-122281 | 5/1991 |
| JP | 06-275530 | 9/1994 |
| JP | 08-291385 | 11/1996 |
| JP | 08291385 A * | 11/1996 |
| WO | WO 96/28585 A1 | 9/1996 |

* cited by examiner

METHOD FOR FORMING THIN FILM AND APPARATUS FOR FORMING THIN FILM

TECHNICAL FIELD

The present invention relates to a thin film forming method and thin film forming apparatus for forming a thin film containing a metal element on a substrate by chemical vapor deposition which utilizes the thermal decomposition reaction of an organometallic compound.

BACKGROUND ART

An MOCVD (Metal Organic Chemical Vapor Deposition) has been conventionally known which forms a compound semiconductor film by utilizing the thermal decomposition reaction of an organometallic compound. This MOCVD can form a thin film made of a ferroelectric such as PZT, which is used in a semiconductor device such as a memory.

DISCLOSURE OF INVENTION

[Problem to be Solved by the Invention]

To form a thin film made of a ferroelectric such as PZT on a semiconductor device, a film must be formed at a low temperature of 450° C. or less, and a sufficient film formation rate must be obtained. When a PZT film is to be formed, the uniformity in its composition must be ensured. In the conventional MOCVD, however, it is difficult to satisfy both the uniformity in composition of a thin film and a sufficient film forming rate.

In contrast, a technique for increasing the uniformities in composition and thickness of a thin film by using a shower head has been known. On the other hand, a technique for increasing a film formation rate by preheating an organic metal gas serving as a source gas and supplying it on a substrate has been known. There is thus provided a technique for preheating a source gas by a heater arranged between the shower head and a substrate in order to increase a film formation rate while using a shower head.

However, this technique has the following problem.

(a) In metal oxide film formation, an oxidizing gas is also supplied to the substrate as the source gas. In this case, when a heater is exposed, it is unpreferably oxidized.

(b) When preheating is performed near the gas introduction portion of the shower head, a highly reactive component is generated by preheating. Since this component easily attaches to the inner wall of the shower head, the nozzles of the shower head clog. In addition, when a multicomponent metal oxide film such as a PZT film is to be formed, since some components contained in the film are to be easily deposited by preheating and others are not, the supply amount of only a certain component may be reduced.

For these reasons, when preheating is performed before film formation, the uniformities in thickness and composition of a film in film formation degrade.

The present invention has been made to solve the above problem, and has as its object to provide a thin film forming method and thin film forming apparatus which can ensure the satisfactory composition of a thin film and the uniformity in thickness thereof, and increase a film formation rate.

[Means of Solution to the Problem]

In a thin film forming method of the present invention, an inside in the vicinity of a substrate-side surface of gas supply means for supplying an organic metal gas to a surface of a substrate at uniform density is heated to a temperature higher than a thermal decomposition point of an organic metal gas but lower than a film forming temperature.

As described above, the organic metal gas can be supplied to the surface of the substrate at uniform density by using the gas supply means. Heating a local portion immediately before the position of uniform supply of the organic metal gas from the gas supply means enables the thermal decomposition of the organic metal gas. In forming a thin film, e.g., a PZT film in which the uniformity in composition is very important, an intermediate product thermally decomposed without impairing the uniformity in composition can be supplied to the surface of the substrate. Therefore, a film formation rate can increase without impairing the uniformities in thickness and composition of the film.

In another thin film forming method of the present invention, an inside at only a periphery of an ejection hole for an organic metal gas, out of two gas ejection holes provided to gas supply means for supplying an organic metal gas and oxidizing gas to a surface of a substrate at uniform density, is heated to a temperature higher than a thermal decomposition point of an organic metal gas but lower than a film forming temperature.

As described above, since only the inside at the periphery of the ejection holes for the organic metal gas is heated to a temperature higher than the thermal decomposition point of the organic metal gas but lower than the film forming temperature, the organic metal gas can be thermally decomposed, thereby supplying a thermally decomposed intermediate product to the surface of the substrate.

In a thin film forming apparatus of the present invention, gas supply means having a plurality of ejection holes which supply an organic metal gas to a surface of the substrate at uniform density is provided in a reaction chamber, and a heater for heating the organic metal gas to a temperature higher than a thermal decomposition point of an organic metal gas but lower than a film forming temperature is incorporated near a substrate-side surface of the gas supply means.

As described above, the organic metal gas can be supplied to the surface of the substrate at uniform density by using the gas supply means. Heating, by a heater, a local portion immediately before the position of uniform supply of the organic metal gas from the gas supply means enables the thermal decomposition of the organic metal gas. In forming a thin film, e.g., a PZT film in which the uniformity in composition is very important, an intermediate product thermally decomposed without impairing the uniformity in composition can be supplied to the surface of the substrate. Therefore, a film formation rate can increase without impairing the uniformities in thickness and composition of the film.

In another thin film forming apparatus of the present invention, gas supply means having a plurality of first ejection holes which supply an organic metal gas to a surface of the substrate at uniform density and a plurality of second ejection holes which supply an oxidizing gas at uniform density are provided in a reaction chamber, and a heater for heating the organic metal gas to a temperature higher than a thermal decomposition point of an organic metal gas but lower than a film forming temperature is incorporated around the first ejection holes of the gas supply means.

As described above, since the periphery of the first ejection holes is heated by a heater to a temperature higher than the thermal decomposition point of the organic metal gas but lower than the film forming temperature, the organic metal gas can be thermally decomposed, thereby supplying the thermally decomposed intermediate product to the surface of the substrate.

BEST MODE OF CARRYING OUT THE INVENTION

Figure 1:
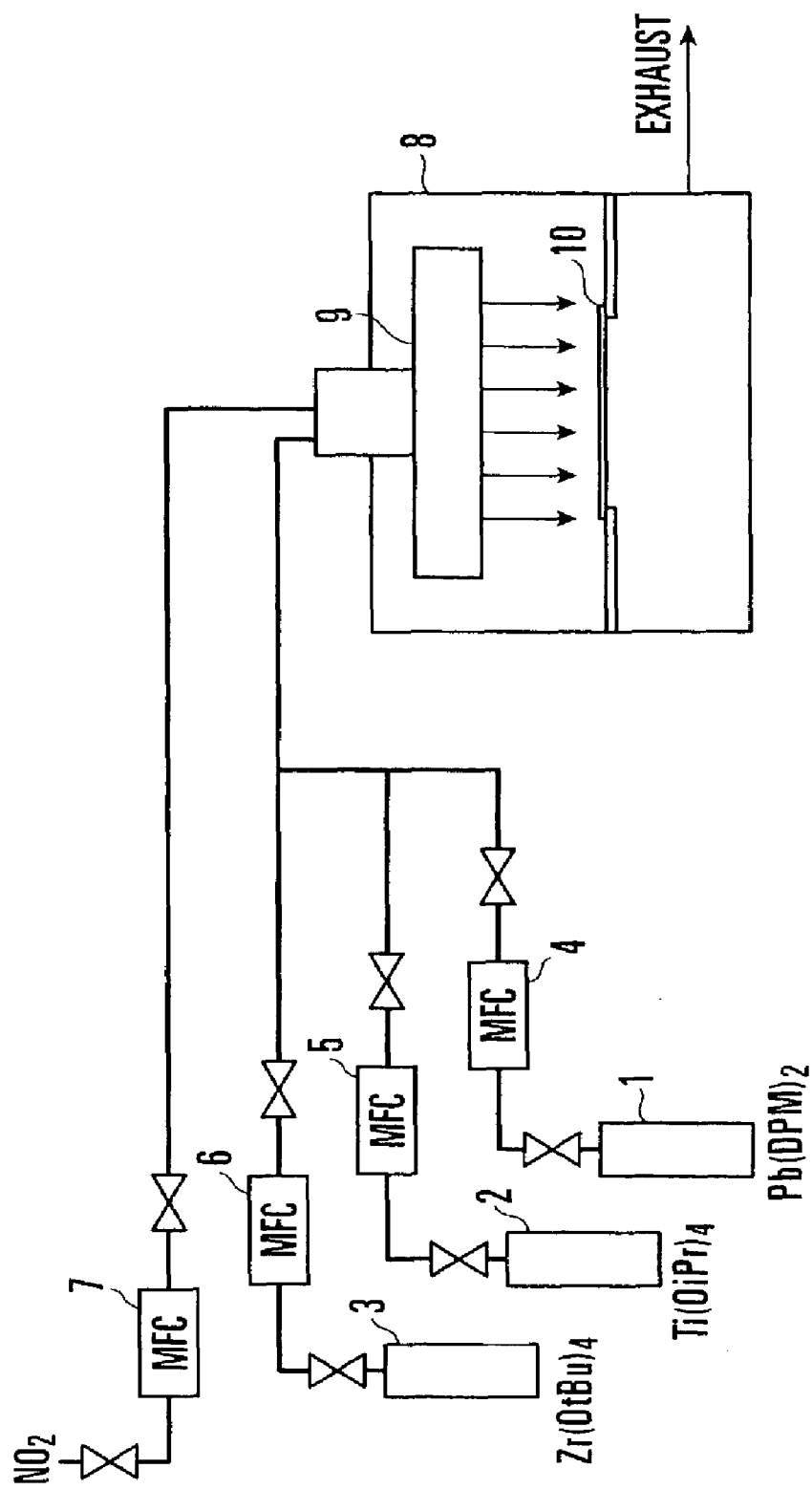
FIG. 1 is a block diagram showing the arrangement of an MOCVD system according to an embodiment of the present invention.

An embodiment of the present invention will be described in detail with reference to the accompanying drawings. FIG. 1 is a block diagram showing the arrangement of an MOCVD system according to an embodiment of the present invention.

In FIG. 1, reference numeral 1 denotes a source tank which holds a lead dibivaloylmethane complex $Pb(DPM)_2$; 2, a source tank which holds an organometallic compound source containing Ti, e.g., $Ti(OiPr)_4$; 3, a source tank which holds an organometallic compound source containing Zr, e.g., $Zr(OtBt)_4$; 4 to 7, mass-flow controllers for respectively controlling the flow rates of $Pb(DPM)_2$ gas, $Ti(OiPr)_4$ gas, $Zr(OtBt)_4$ gas, and $NO_2$ gas; 8, a reaction chamber; 9, a shower head serving as a gas supply means; and 10, a semiconductor substrate.

Figure 2:
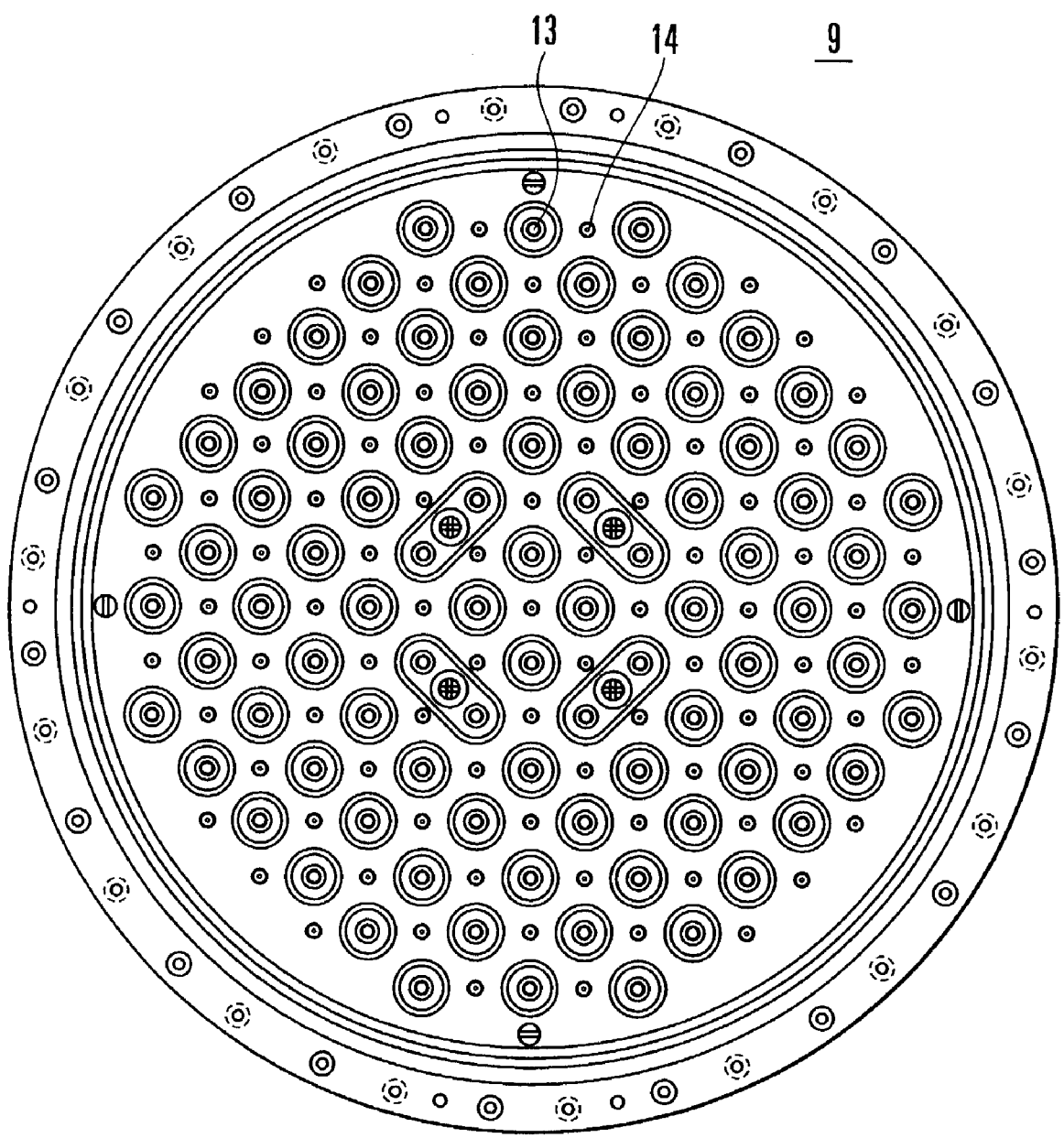
FIG. 2 is a bottom view of a shower head shown in FIG. 1.
Figure 3:
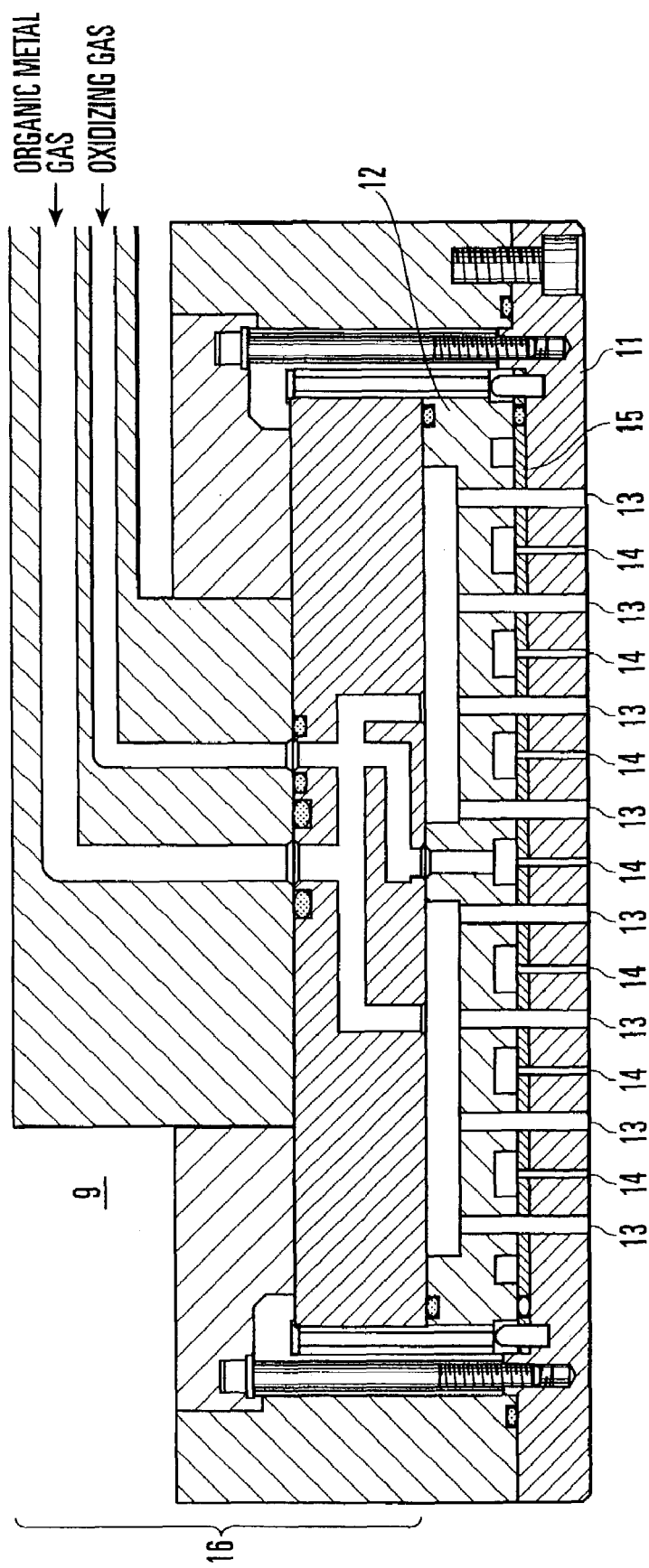
FIG. 3 is a sectional view of the shower head shown in FIG. 1.

In this embodiment, the shower head 9 is used as a means for supplying an organic metal gas and oxidizing gas to the substrate 10 at uniform density. FIG. 2 is a bottom view of the shower head 9, and FIG. 3 is a sectional view of the shower head 9.

Figure 4:
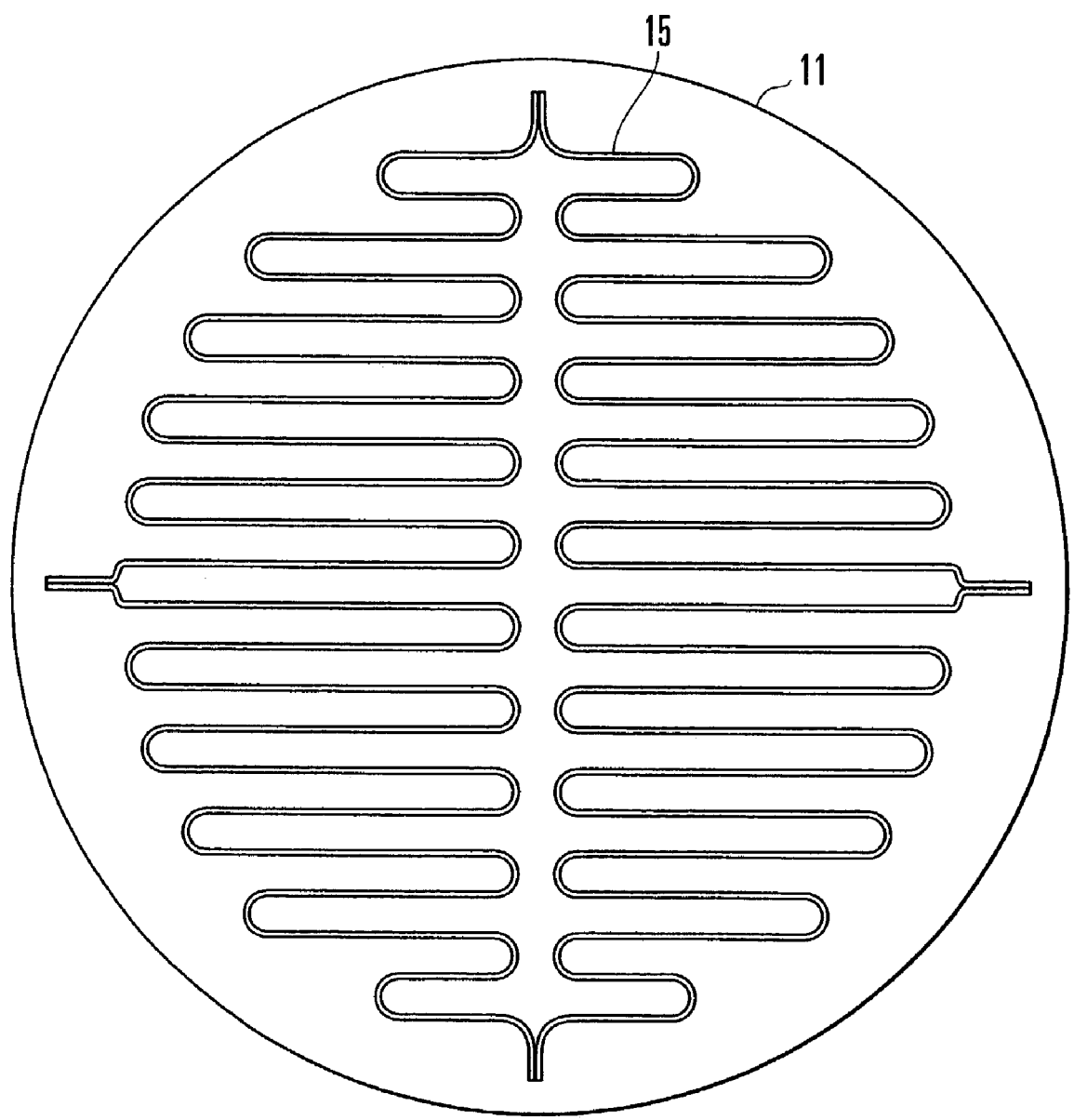
FIG. 4 is a plan view showing the pattern of a heater.

The lower structure of the shower head 9 is constructed by AlN ceramic plates 11 and 12 with good thermal conductivity. The ceramic plates 11 and 12 have a plurality of first ejection holes 13 for ejecting an organic metal gas and a plurality of second ejection holes 14 for ejecting an oxidizing gas ($NO_2$ gas). A heater 15 having a shape shown in FIG. 4 is printed on the upper surface of the AlN ceramic plate 11, which is formed to detour the ejection holes 13 and 14. The ceramic plates 11 and 12 accordingly sandwich the heater 15 therebetween. The heater 15 generates heat by making a current flow therein, so that the ceramic plates 11 and 12 are heated to a temperature (e.g., 240° C. when a PZT film is to be formed as in this embodiment) higher than the thermal decomposition point of the organic metal gas but lower than the film forming temperature.

In contrast, an upper structure 16 of the shower head 9 is made of Al. The upper structure 16 is heated by a heater (not shown) to a temperature (e.g., 200° C. when the PZT film is to be formed) higher than a temperature at which the organic metal gas can keep the vapor state but lower than the thermal decomposition point of the organic metal gas. When a buffer plate (not shown) made of $Al_2O_3$ or the like which has thermal conductivity lower than that of AlN is then formed between the AlN ceramic plate 12 and upper structure 16, the AlN ceramic plates 11 and 12 can be kept at a temperature higher than that of the upper structure 16.

A thin film forming method using the above-described MOCVD system will be described next. First, the source tank 1 is heated to evaporate the lead dibivaloylmethane complex $Pb(DPM)_2$, and the source tank 2 is simultaneously heated to evaporate an organometallic compound source $Ti(OiPr)_4$. The resultant $Pb(DPM)_2$ gas and $Ti(OiPr)_4$ gas and $NO_2$ gas are introduced into the evacuated reaction chamber 8. At this time, the pressure of the reaction chamber 8 is 0.005 torr, the flow rate of $Pb(DPM)_2$ gas is 0.2 sccm, the flow rate of $Ti(OiPr)_4$ gas is 0.14 sccm, the flow rate of $NO_2$ gas is 2.3 sccm, and a film forming temperature (substrate temperature) is 445° C. Under these conditions, $Pb(DPM)_2$ gas and $Ti(OiPr)_4$ gas pass through a path shown in FIG. 3 and are ejected from the ejection holds 13, and $NO_2$ gas passes through a path shown in FIG. 3 and is ejected from the ejection holes 14. With this processing, a crystal nucleus with a perovskite structure made of $PbTiO_3$ is formed on the substrate 10.

Successively, the source tank 3 is heated to evaporate $Zr(OtBt)_4$, and the resultant $Zr(OtBt)_4$ gas is introduced into the reaction chamber 8 together with the gases described above. The flow rate of $Zr(OtBt)_4$ gas is 0.175 sccm, and other conditions are the same as in the above description. $Zr(OtBt)_4$ gas is ejected from the ejection holes 13 together with $Pb(DPM)_2$ gas and $Ti(OiPr)_4$ gas. With this processing, a PZT. film ($PbZrxTi1-xO_3$ film) with the perovskite structure is formed on the substrate 10.

In this embodiment, the organic metal gas and oxidizing gas can be supplied to the surface of the substrate 10 at uniform density by using the shower head 9. The gas pipes to the shower head 9 are kept at a temperature (160 to 200° C. when the PZT film is to be formed) lower than thermally decomposition point of the organic metal gas, and the vicinity of the ejection holes 13 of the shower head 9 is heated to a temperature higher than the thermal decomposition point of the organic metal gas. With this processing, the organic metal gas which is easily thermally decomposed can be transported to the vicinity of the ejection holes of the shower head 9 and then thermally decomposed at the vicinities of the ejection holes 13. Therefore, the film formation rate can be made twice or more the conventional rate, from 10 nm/min to 25 nm/min. Note that the heater 15 heats both the ejection holes 13 and 14 in this embodiment. However, if the heater 15 heats only the vicinity of the ejection holes 13, the same effect can also be obtained.

Since the AlN has good thermal conductivity, variations in temperature of the substrate-side surface of the shower head 9 can be suppressed within ±1° C., thereby obtaining the satisfactory uniformity in temperature. Thus, the satisfactory composition and uniformity in thickness of the thin film formed on the substrate 10 can be ensured, and the film formation rate can be greatly increased as compared with that in the prior art.

Note that a nucleus forming process and a film forming process are performed at a high vacuum of 0.005 torr in this embodiment, but the film forming process may be performed at a low vacuum. That is, the lead dibivaloylmethane complex $Pb(DPM)_2$ and organometallic compound source $Ti(OiPr)_4$ are dissolved in an organic solvent (butyl acetate solution) and evaporated together with the organic solvent, and the resultant gas is introduced into the reaction chamber 8 at a pressure of 0.005 torr to form a nucleus. Successively, the organometallic compound source $Zr(OtBt)_4$ is dissolved in the organic solvent together with the above-described $Pb(DPM)_2$ and $Ti(OiPr)_4$ and evaporated with the organic solvent, and the resultant gas is introduced into the reaction chamber 8 at a pressure of about 0.1 to 0.5 torr to form a film. At this time, to make the respective partial pressures equal, an inert gas is introduced so as to make a total flow rate of gases about 20 to 100 times. This can increase the internal pressure of the shower head 9, thereby uniformity supplying the organic metal gas to the surface of the substrate.

This embodiment uses the post-mix type shower head 9 which supplies the organic metal gas and the oxidizing gas independently. However, a pre-mix type shower head for supplying the organic metal gas and oxidizing gas together may be used. In addition, the PZT film is formed on the substrate 10 in this embodiment, but the film is not obviously limited to the PZT film.

As described above, according to this embodiment, the inside of the vicinity of the substrate-side surface of the shower head 9 is heated to a temperature higher than the thermal decomposition point of the organic metal gas but lower than the film forming temperature. With this processing, the satisfactory composition and uniformity in thickness of the thin film formed on the substrate 10 can be ensured, and the film formation rate can be greatly increased as compared with that in the prior art. As a result, a thin film forming apparatus with good mass production can be realized. In addition, since the inside of the vicinity of the substrate-side surface of the shower head 9 is to be heated, the heater 15 is not exposed, thereby preventing the heater 15 from oxidiation.

INDUSTRIAL APPLICABILITY

As has been described above, the present invention is suitable to forming a high-quality thin film.

The invention claimed is:

1. A thin film forming method of forming a thin film containing a metal element on a substrate by chemical vapor deposition which utilizes a thermal decomposition reaction of an organometallic compound, characterized by comprising heating, to a temperature higher than a thermal decomposition point of an organic metal gas but lower than a film forming temperature, an inside of a gas supply means for supplying an organic metal gas to a surface of the substrate at uniform density, wherein the heating occurs at a substrate-side of the gas supply means.

2. A thin film forming method of forming a thin film containing a metal element on a substrate by chemical vapor deposition which utilizes a thermal decomposition reaction of an organometallic compound, characterized by comprising heating, to a temperature higher than a thermal decomposition point of an organic metal gas but lower than a film forming temperature, a portion of a gas supply means for supplying an organic metal gas and oxidizing gas to a surface of the substrate at uniform density, wherein the gas supply means comprises a plurality of first ejection holes for supplying the organic metal gas and a plurality of second ejection holes for supplying the oxidizing gas and only a peripheral portion of said first ejection holes are heated.

3. A thin film forming method according to claim 1, wherein the organometallic compound includes an organometallic compound containing Pb, an organometallic compound containing Ti, and an organometallic compound containing Zr, and the thin film includes a PZT film.

4. A thin film forming method according to claim 3, wherein the substrate-side of said gas supply means is heated to 240° C.

5. A thin film forming method according to claim 3, wherein the gas supply means has a first partial structure having ejection holes for the organic metal gas and a second partial structure having a flow path for the organic metal gas communicating with the ejection holes, and the first partial structure is heated to 240° C., and the second partial structure is heated to 200° C.

6. A thin film forming method according to claim 1, wherein the gas supply means has a first partial structure having ejection holes for the organic metal gas and a second partial structure having a flow path for the organic metal gas communicating with the ejection hole, and the first partial structure is heated to a temperature higher than the thermal decomposition point of the organic metal gas but lower than the film forming temperature, and the second partial structure is heated to a temperature lower than the thermal decomposition point of the organic metal gas.

* * * * *